US010487388B2

(12) United States Patent
Schier

(10) Patent No.: US 10,487,388 B2
(45) Date of Patent: Nov. 26, 2019

(54) TOOL WITH TIALCRSIN PVD COATING

(71) Applicant: Walter AG, Tübingen (DE)

(72) Inventor: Veit Schier, Leinfelden-Echterdingen (DE)

(73) Assignee: Walter AG, Tübingen (DE)

( * ) Notice: Subject to any disclaimer, the term of this patent is extended or adjusted under 35 U.S.C. 154(b) by 672 days.

(21) Appl. No.: 14/425,098

(22) PCT Filed: Sep. 27, 2013

(86) PCT No.: PCT/EP2013/070165
§ 371 (c)(1),
(2) Date: Mar. 2, 2015

(87) PCT Pub. No.: WO2014/049105
PCT Pub. Date: Apr. 3, 2014

(65) Prior Publication Data
US 2015/0232978 A1 Aug. 20, 2015

(30) Foreign Application Priority Data
Sep. 28, 2012 (DE) .................. 10 2012 109 254

(51) Int. Cl.
C23C 14/06 (2006.01)
B23B 27/14 (2006.01)
C23C 14/32 (2006.01)
C23C 28/00 (2006.01)
C23C 30/00 (2006.01)
C23C 28/04 (2006.01)

(52) U.S. Cl.
CPC ........ *C23C 14/0641* (2013.01); *B23B 27/148* (2013.01); *C23C 14/325* (2013.01); *C23C 28/042* (2013.01); *C23C 28/044* (2013.01); *C23C 28/42* (2013.01); *C23C 30/005* (2013.01); *Y10T 428/24355* (2015.01); *Y10T 428/24975* (2015.01)

(58) Field of Classification Search
CPC ............ C23C 14/0641; C23C 228/044; C23C 228/042; C23C 228/42; C23C 230/005; C23C 14/325; Y10T 428/24975; Y10T 428/24355; B32B 27/148
See application file for complete search history.

(56) References Cited

U.S. PATENT DOCUMENTS

| 6,245,446 | B1 | 6/2001 | Schier et al. |
| 7,348,074 | B2 | 3/2008 | Derflinger |
| 7,758,975 | B2 | 7/2010 | Schier |
| 8,673,435 | B2 | 3/2014 | Kudo et al. |
| 8,758,890 | B2 | 6/2014 | Bölmark et al. |
| 2001/0031347 | A1* | 10/2001 | Vetter ............... C23C 28/044 428/216 |
| 2006/0127671 | A1* | 6/2006 | Park ..................... C23C 4/12 428/408 |
| 2006/0222893 | A1* | 10/2006 | Derflinger ........ C23C 14/0641 428/698 |
| 2006/0269788 | A1 | 11/2006 | Ishikawa |
| 2008/0028684 | A1* | 2/2008 | Schier ............... C23C 28/044 51/295 |
| 2008/0131726 | A1* | 6/2008 | Derflinger ........ C23C 14/0641 428/627 |
| 2008/0166583 | A1 | 7/2008 | Astrand |
| 2008/0166588 | A1* | 7/2008 | Astrand ............ C23C 14/0641 428/635 |
| 2010/0215951 | A1* | 8/2010 | Shibata ............. C23C 28/042 428/336 |

(Continued)

FOREIGN PATENT DOCUMENTS

| CN | 1876368 A | 12/2006 |
| CN | 101578396 A | 11/2009 |
| EP | 1174528 B1 | 1/2006 |

(Continued)

OTHER PUBLICATIONS

EPO Translation of JP-2011235393-A (Year: 2017).*
Office Action dated Dec. 30, 2016, for corresponding Chinese Patent Application No. 201380049876.9.
English Translational of International Preliminary Report on Patentability in International Application No. PCT/EP2013/070165, dated Apr. 9, 2015.
Office Action dated Jun. 13, 2017, issued in corresponding Japanese Patent Application No. 2015-533603.

(Continued)

*Primary Examiner* — Frank J Vineis
*Assistant Examiner* — Michael Zhang
(74) *Attorney, Agent, or Firm* — Morgan, Lewis & Bockius LLP

(57) ABSTRACT

Tool with main body made of carbide, cermet, ceramic, steel or high-speed steel and multi-layer wear-protection coating applied on the main body using a PVD process. The wear-protection coating comprises at least one layer (A) of $Ti_aAl_{(1-a)}N$ where $0.33 \leq a \leq 1$ with layer thickness of 20 nm to 3 μm and at least one layer (B) comprising a sequence of at least 4 sub-layers arranged alternately in a stack, of $Ti_bSi_{(1-b)}N$ and $Al_cCr_{(1-c)}N$ where $0.70 \leq b \leq 0.98$ and $0.3 \leq c \leq 0.75$ with sub-layer thickness of 0.5 nm to 15 nm, and optionally further comprises a layer (C) of $Ti_dSi_{(1-d)}N$ where $0.70 \leq d \leq 0.98$ with layer thickness of 50 nm to 1 μm. The wear-protection coating can have further carbide layers and layers (A), (B) and (C) can contain up to 10 at. % of other metals, B, C and/or O per layer, depending on the process.

22 Claims, No Drawings

(56) References Cited

U.S. PATENT DOCUMENTS

2011/0135898 A1* 6/2011 Bohlmark ............... C23C 14/00
428/216

FOREIGN PATENT DOCUMENTS

| | | |
|---|---|---|
| EP | 1939327 A1 | 7/2008 |
| EP | 2100985 A1 | 9/2009 |
| EP | 2298954 A1 | 3/2011 |
| EP | 1992717 B1 | 2/2012 |
| JP | 2005-111574 A | 4/2005 |
| JP | 2008-093760 A | 4/2008 |
| JP | 2008-188689 A | 8/2008 |
| JP | 2010-207916 A | 9/2010 |
| JP | 2011-115941 A | 6/2011 |
| JP | 2011-235393 A | 11/2011 |
| JP | 2011235393 A * | 11/2011 |
| WO | 96/23911 A1 | 8/1996 |
| WO | 2005/085499 A1 | 9/2005 |
| WO | 2006/041367 A1 | 4/2006 |
| WO | 2006/102780 A1 | 10/2006 |
| WO | 2012/005275 A1 | 1/2012 |

OTHER PUBLICATIONS

International Search Report and Written Opinion dated Jan. 16, 2014 for International application No. PCT/EP2013/070165.
German Search Report in 10 2012 109 254.0 dated May 21, 2013.
Office Action dated Jun. 5, 2018, issued in corresponding Japanese Patent Application No. 2015-533603.
Japanese Office Action dated May 7, 2019 issued in JP Patent Application 2015-533603 (with English translation).

* cited by examiner

TOOL WITH TIALCRSIN PVD COATING

RELATED APPLICATIONS

The present application is a U.S. National Phase Application of International Application No. PCT/EP2013/070165, filed 27 Sep. 2013, which claims priority to German Application No. 10 2012 109 254.0, filed 28 Sep. 2012.

OBJECT OF THE INVENTION

The invention relates to a tool with a main body made of hard metal, cermet, ceramic, steel or high-speed steel, and a single-layer or multi-layer wear protection coating applied thereon by the PVD process.

BACKGROUND TO THE INVENTION

Cutting tools, in particular tools for metal-removing machining, consist of a main body which is made for example of hard metal, cermet, ceramic, steel or high-speed steel. To increase the tool life or to improve the cutting properties, a single-layer or multi-layer wear protection coating made of hard materials is frequently applied to the main body by means of CVD or PVD processes. The PVD processes come in a number of different variants such as magnetron sputtering, arc vapour deposition (arc PVD), ion plating, electron beam vapour deposition and laser ablation. Magnetron sputtering and arc vapour deposition are the PVD processes which are used most often for coating of tools. Individual PVD process variants in turn include a variety of modifications such as for example unpulsed or pulsed magnetron sputtering and unpulsed or pulsed arc vapour deposition, etc.

The target in the PVD process can consist of a pure metal or a combination of two or more metals. When the target comprises a plurality of metals, all these metals are incorporated at the same time into the coating layer built up during the PVD process. When the targets are composed of a mixture of metals, the quantitative ratio of the metals in the layer that is built up is essentially determined by the quantitative ratio of the metals in the target.

To produce certain metal compounds, the reaction chamber of the PVD process is supplied with reactive gases such as for example nitrogen to produce nitrides, oxygen to produce oxides, carbon-containing compounds to produce carbides, or mixtures of these gases to produce corresponding mixed compounds such as carbonitrides, oxycarbides, etc.

WO 96/23911 A1 describes a wear protection coating on a substrate, consisting of a layer of hard material applied directly on the substrate and over it a sequence of from 10 to 1000 further individual layers which consist in alternation of a metal hard material and a covalent hard material with the individual layers having a thickness of between 1 and 30 nm. The periodically alternating arrangement of individual layers of metal hard materials and covalent hard materials is designed to improve the mechanical and chemical properties of the wear protection coating.

WO 2006/041367 A1 describes a coated cutting tool consisting of a hard metal substrate and a coating deposited by the PVD process comprising at least one layer of TiAlN with a thickness of from 1.5 to 5 µm and an internal compression stress of >4 to 6 GPa. The layer of TiAlN is designed to exhibit improved adhesion to the substrate compared with known layers.

EP 2 298 954 A1 describes a method for producing a coated cutting tool on which a coating of hard material, such as for example TiAlN, TiAlCrN or TiAlCrSiN, is applied to a substrate by means of a PVD process, varying the bias voltage of the substrate during the deposition process. The method is designed to give the tool improved wear resistance and a longer life.

EP 1 992 717 describes a target for deposition of a layer of hard material by the PVD process which can contain Ti, Al, Cr, Si, B, C and N within different quantitative ranges.

EP 1 174 528 describes a cutting tool with a multi-layer wear protection coating which comprises a first layer of hard material and a second layer of hard material, the first layer of hard material containing one or more of the metals Ti, Al and Cr and one or more of the non-metals N, B, C and O and the second layer of hard material containing Si and one or more of the metals of the groups 4a, 5a and 6a of the Periodic System and Al and one or more of the non-metals N, B, C and O.

Particularly high demands are made on the tool for certain metal machining operations such as milling and turning for example. Important parameters for such tools are high temperature stability, high hardness, high fracture toughness and a high modulus of elasticity (E-modulus, Young's modulus).

Cutting tools and their wear protection coatings are usually designed for certain applications, and compromises normally have to be made as regards the properties named above when they are essential for the application as not all the desired properties can be optimised at the same time. Therefore there is a need for further improvement in the properties of wear protection coatings which are important for certain applications.

Known $Ti_{85}Si_{15}N$ layers in wear protection coatings have for example very high hardness and very high E-moduli but comparatively poor tribochemical properties at high temperatures. Much the same is true of $Al_{70}Cr_{30}N$ layers. In contrast to these, $Ti_{50}Al_{50}N$ layers exhibit better tribochemical behaviour at high temperatures but lower hardness and lower E-moduli.

OBJECTIVE

The objective of the present invention was to provide a tool for material-removing machining of materials, in particular steels, with a coating which is improved compared to the prior art and exhibits high hardness, high fracture toughness, a high modulus of elasticity and good high temperature stability, in particular for milling, boring and turning of steels.

DESCRIPTION OF THE INVENTION

This objective is achieved by a tool with a main body made of hard metal, cermet, ceramic, steel or high-speed steel and a multi-layer wear protection coating which is applied on the main body by the PVD process, the wear protection coating comprising at least one layer (A) of $Ti_aAl_{(1-a)}N$ with $0.33 \leq a \leq 1$ and with a layer thickness of from 20 nm to 3 µm and at least one layer (B) of a sequence of at least 4 alternating superposed sublayers of $Ti_bSi_{(1-b)}N$ and $Al_cCr_{(1-c)}N$ with $0.70 \leq b \leq 0.98$ and $0.3 \leq c \leq 0.75$ and with a layer thickness of the sublayers of from 0.5 nm to 15 nm and optionally in addition at least one layer (C) of $Ti_dSi_{(1-d)}N$ with $0.70 \leq d \leq 0.98$ and with a layer thickness of from 50 nm to 1 µm, wherein the wear protection coating can exhibit further layers of hard material and wherein the layers (A), (B) and (C) can contain up to 10 at. % of further metals, B, C and/or O per layer depending on the process.

Surprisingly, it has been shown that due to the new wear protection coating, tools of the kind according to the invention exhibit improved cutting results and reduced wear compared with known tools according to the prior art. The wear protection coating according to the invention has high hardness, high fracture toughness, a high modulus of elasticity and good high temperature stability, which is advantageous in particular for milling, boring and turning of steels.

The wear protection coatings according to the invention with the combination of TiAlN layers (A) and layers (B) with alternating superposed TiSiN and AlCrN sublayers and optionally TiSiN layers (C) are characterised by a higher resistance to wear and longer tool life, in particular due to reduced chipping of the coating at the cutting edge.

Without wishing to tie themselves to a theory in this connection, the inventors assume that in the layer (B) the change in the composition of the layers in the few nanometers thin superposed TiSiN and AlCrN sublayers due to the different lattice constants in the lattice which is a cubically face-centered lattice, leads to a variation in the internal stress conditions of the layer (B) which favours the advantageous properties of the wear protection coating according to the invention.

In spite of their tiny thickness, the only a few nanometers thin superposed TiSiN and AlCrN sublayers in the layer (B) according to the invention with different compositions can be detected and differentiated under the transmission electron microscope (TEM). The technique has been well known to the specialist in the art for a long time.

In one preferred form of embodiment of the invention, the layer (B) exhibits a sequence of at least 4 sublayers of $Ti_bSi_{(1-b)}$ and 4 sublayers of $Al_cCr_{(1-c)}N$ arranged superposed in alternation. Thus in this form of embodiment the total number of the sublayers of $Ti_bSi_{(1-b)}$ and $Al_cCr_{(1-c)}N$ is at least 8. If the number of the sublayers of $Ti_bSi_{(1-b)}$ and $Al_cCr_{(1-c)}N$ is too low, higher hardness values and higher E-moduli can be obtained compared with the prior art, but the insufficient thickness of the layer (B) has a disadvantageous effect on the wear resistance of the coating as a whole.

In a further preferred form of embodiment of the invention, the layer (B) exhibits a sequence of at most 1500 sublayers of $Ti_bSi_{(1-b)}$ and 1500 sublayers of $Al_cCr_{(1-c)}N$ arranged superposed in alternation. Thus in this form of embodiment the total number of the sublayers of $Ti_bSi_{(1-b)}$ and $Al_cCr_{(1-c)}N$ is at most 3000. If the number of the sublayers of $Ti_bSi_{(1-b)}$ and $Al_cCr_{(1-c)}N$ is too high, this leads to an excessive total thickness of the wear protection coating with the result that the coating fails more rapidly in the region of the cutting edge.

In a further preferred form of embodiment of the invention, the layer (B) exhibits a total layer thickness of from 40 nm to 3 µm. If the total layer thickness of the layer (B) is too low, the layer (B) loses the advantageous mechanical properties. If the total layer thickness of the layer (B) is too high, this leads to an excessive total thickness of the wear protection coating with the result that the coating fails more rapidly in the region of the cutting edge.

In a further preferred form of embodiment of the invention, the wear protection coating exhibits one of the following sequences of layers, in which m, n, o, p, q and r are whole numbers>0:

[A-B]$_n$ with $1 \leq n \leq 100$, preferably $1 \leq n \leq 20$, $([A-B]_n\text{-}C)_m$ with $1 \leq n \leq 100$, preferable $1 \leq n \leq 20$, and $1 \leq m \leq 20$, preferably $1 \leq m \leq 5$ A-[B-C]$_n$ with $1 \leq n \leq 30$ $\{([A-B]_o\text{-}C)_q\text{-}(A\text{-}[B\text{-}C]_p)_r\}_m$ with $1 \leq o \leq 30$, $1 \leq p \leq 30$, $1 \leq q \leq 30$, $p+q \geq 2$, $(13q+25r)m \leq 500$.

Preferably the TiAlN layer (A) is the innermost layer of the wear protection coating and in direct contact with the substrate surface of the main body. The TiAlN layer (A) contributes to very good adhesion of the wear protection coating on the substrate surface and so reduces the danger of chipping or peeling of the wear protection coating.

In a further preferred form of embodiment of the invention, the sublayers of $Ti_bSi_{(1-b)}$ and $Al_cCr_{(1-c)}N$ exhibit layer thicknesses of from 1.0 nm to 12 nm, particularly preferably of from 3.0 nm to 9.0 nm.

The sublayers of $Ti_bSi_{(1-b)}N$ and $Al_cCr_{(1-c)}N$ according to the invention with $0.70 \leq b \leq 0.98$ and $0.3 \leq c \leq 0.75$ in the layer (B) advantageously exhibit a cubically face-centered crystal structure.

If the Si content in the $Ti_b Si_{(1-b)}N$ layer is too high, there is the danger that the layer will become amorphous. The $Ti_bSi_{(1-b)}N$ layer would then have an insufficient hardness for the purpose according to the invention. It was found that the hardness of the $Ti_bSi_{(1-b)}N$ layer increases up to an Si content of approximately 15 at. %, i.e. b>0.85, and then the hardness declines. Within the concentration range according to the invention the $Ti_bSi_{(1-b)}N$ layer exhibits a high hardness and a high E-modulus.

If the Al content in the $Al_cCr_{(1-c)}N$ layer is too high, i.e. greater than 75 at. %, there is the danger that the layer will adopt the hexagonal crystal structure which has an insufficient hardness for the purpose according to the invention and is not stable at high temperatures.

In a further preferred form of embodiment of the invention, the wear protection coating exhibits a total thickness of from 0.5 µm to 10 µm, preferably of from 0.7 µm to 5 µm, particularly preferably of from 1.0 µm to 3.0 µm, quite particularly preferably of from 1.5 µm to 2.5 µm. If the total thickness of the wear protection coating is too low, premature wear occurs at the cutting edge due to excessive abrasive and/or tribochemical wear and/or due to failure of the substrate through overheating. If the total layer thickness of the wear protection coating is too high, the total compressive stress of the coating in the region of the cutting edge becomes too high and adhesive or cohesive failure of the wear protection coating takes place or a mechanical failure of the substrate occurs, in particular in the case of hard metal substrates.

In a further form of embodiment, the wear protection coating of the tool according to the invention can exhibit further layers of hard material. Additional layers of hard material or combinations thereof, e.g. TiAlN, TiN, AlCrN, TiCN etc., can be present between the substrate and the sequence of layers according to the invention which comprises the layers (A), (B) and optionally (C). In addition, outer layers in the form of wear indicator layers, pure metal layers, e.g. Al, Zr, or Nb, or even metal oxide layers, e.g. $Al_2O_3$, $[AlCr]_2O_3$, $ZrO_2$ or $Cr_2O_3$, can be present over the sequence of layers according to the invention provided these additional layers do not significantly impair the properties of the tool according to the invention.

In one preferred form of embodiment, the wear protection coating according to the invention exhibits at least in regions a thin wear recognition layer arranged as the outermost layer, preferably a TiN or ZrN layer, with a thickness of from 0.1 to 1.5 μm. Wear recognition layers of the kind named previously are known per se and used primarily as decorative layers and/or to indicate whether the tool has already been used and to what extent and how severe the wear in the course of its use has been. The thin wear recognition or indicator layer is visibly worn away when the tool is used and the underlying, usually different coloured wear protection coating becomes visible when wear is more advanced.

The wear protection coating according to the invention expediently exhibits a Vickers hardness HV of from 2500 to 4000, preferably of from 3000 to 3500. The high hardness of the wear protection coating according to the invention has particular advantages when machining metals, particularly when turning and milling, as these metal machining methods among the metal-removing processes using a geometrically defined cutter are the ones that make the highest demands on the cutter material as regards hardness, toughness, resistance to wear and stability at high temperatures. An insufficient hardness has the disadvantage that the resistance of the coating to wear decreases. An excessive hardness has the disadvantage that the concomitant compressive stress of the coating is raised and the coating tends to chip off at the cutting edge. With the knowledge of the present invention, the specialist in the art is immediately able to set suitable hardness values for the wear protection coating by varying the compositions of the layers and/or the sequence of the layers and/or the thicknesses of the layers.

In addition, the wear protection coating according to the invention expediently exhibits a modulus of elasticity (E-modulus) of >380 GPa, preferably of >400 GPa. When the tool is subjected to external loadings during the cutting operation, mechanical stresses are generated in the coating and in the substrate the level of which is linked through the modulus of elasticity to the elastic deformation applied. If the modulus of elasticity of the coating is too low, small stresses are created inside the coating when the tool is deformed mechanically in use, which is connected with the disadvantage that the coating is only able to take a small part of the cutting forces. However, if the modulus of elasticity is too high, this has the disadvantage that when mechanical deformation takes place excessive forces are directed through the coating, which can result in its premature destruction.

As already stated, the combination of high hardness and a high modulus of elasticity is particularly advantageous for certain metal machining applications, in particular turning and milling, especially for metal machining operations with interrupted cutting. The high hardness ensures high resistance to wear. However, a high hardness is usually accompanied by increased brittleness. The high modulus of elasticity at the same time ensures that the material exhibits reduced brittleness and is better able to compensate for high alternating mechanical loadings occurring during interrupted cutting for example. The wear protection coating of the tool exhibits these advantageous properties due to the sequence of layers according to the invention.

The values for hardness and modulus of elasticity named previously for preferred forms of embodiment of the invention are measured at and relate to the layer sandwich of the wear protection coating without any wear indicator layer optionally provided as the outermost layer. A wear indicator layer can perform a different function to the layers of the wear protection coating, as described above, and therefore be softer and/or exhibit a different modulus of elasticity. Therefore, measurement of the values for the hardness and modulus of elasticity of the wear protection coating should be carried out without a wear indicator layer arranged over it if it is to be expected that the wear indicator layer will influence the measurement results significantly due to its thickness and/or composition.

The tool according to the invention can take the form of a solid hard metal tool or an indexable cutter insert, the tool according to the invention preferably being an indexable cutter insert. The tool according to the invention exhibits quite particularly surprising properties when used as a copying smoothing or finishing cutter for hard milling of steels.

In a further preferred form of embodiment of the tool according to the invention, the wear protection coating exhibits a mean surface roughness Ra, measured over a length of 10 μm, of ≤1.0 μm, preferably ≤0.5 μm.

Suitable methods for smoothing the surface of the tool after the deposition of the coating include known blasting processes, grinding or brushing with correspondingly hard and fine materials. One suitable process for smoothing the surface of the tool is for example wet blasting with glass beads at a pressure of approx. 2.5 bar using a blasting medium consisting of 50% glass beads with a diameter of 70-110 μm and 50% glass beads with a diameter of 40-70 μm. The appropriate blasting treatment time should be established by testing for the desired surface finish or smoothness.

Another suitable process for smoothing the surface of the tool is drag-finishing. A suitable abrasive is for example granulated coconut shell with a fine diamond powder as abrasive and adhesive oil. Wet blasting with corundum with a grit size of 280/320 for example and a blasting medium concentration of approx. 18% in the liquid is particularly suitable for post-treatment. Here the use of a blasting pressure of from approx. 1.5 to 2 bar is expedient, setting the blasting direction and blasting angle according to the type of tool and size of tool.

For the purposes of the invention, the surface roughness was measured on polished test inserts using a HOMMEL-ETAMIC TURBO WAVE V7.32 measuring apparatus from HOMMEL-ETAMIC GmbH, Schwenningen, Germany (sensor: TKU300-96625_TKU300/TS1; measuring range: 80 μm; test distance: 4.8 mm; speed: 0.5 mm/s).

Production of the Wear Protection Coating According to the Invention

The production of the hard material layers according to the invention is carried out by the PVD process, selecting from arc vapour deposition, magnetron, dual magnetron or HIPIMS processes, or combinations of the above-named processes can be used. A coating apparatus of Innova type from Balzers with a rotating substrate carrier was used for deposition of the hard material layers according to the invention. For the targets, use was made of melt-metallurgically or powder-metallurgically produced Ti—Al targets to produce the layers (A) and Ti—Si targets and Al—Cr targets to produce the layers (B) and Ti—Si targets to produce the layers (C) with the appropriate quantitative percentages of the respective metals in each case.

The thickness of the individual layers can be influenced among other things by the settings of the deposition parameters such as temperature, bias voltage, partial pressures of the gases introduced, etc. and by the arrangement of the targets and the setting of the respective substrate movement and rotation in the coating apparatus. However the specialist in the art will know how to carry out the corresponding settings according to the type of apparatus. Prior to being coated, the substrates were subjected to an etch-cleaning operation with Ar ions, with which the specialist in the art will also be familiar.

The hardness and E-modulus (more precisely the so-called reduced E-modulus) are measured by means of nano-indentation. Here a Vickers diamond tester is pressed into the coating and the force-travel curve is plotted during the measurement. This curve can then be used to calculate the mechanical characteristics of the test specimen, among other things the hardness and (reduced) E-modulus. The hardness and the E-modulus of the coating according to the invention were determined using a Fischerscope® H100 XYp from Helmut Fischer GmbH, Sindelfingen, Germany. It should be noted that the depth of indentation should not be more than 10% of the thickness of the coating as otherwise properties of the substrate can distort the measurements.

Internal stresses in the coating according to the invention can be checked by X-ray diffraction. This makes it possible to differentiate between internal stresses of first, second and third order which differ in their range and hence in their effect on the adhesion of the coating. As regards the adhesion of the wear protection coating on the main body, it has proved to be advantageous if the internal stresses of first and second order do not become too high in the coating, expediently no higher than −5 Gpa (compressive stress).

In a further preferred form of embodiment of the invention, the tool also exhibits a rounded cutting edge with an edge radius in the range of from 3 to 10 µm, preferably of from 5 to 7 µm. If the cutting edge radius is too small, there is the danger that that the edge will break off rapidly. If the cutting edge radius is too large, this causes very high cutting forces which have an unfavourable effect on the life of the tool and the form of the chips.

Further advantages, features and forms of embodiment of the present invention are explained further with reference to the following examples.

EXAMPLES

Example 1—Indexable Inserts for Copying Smoothing or Finishing Milling Cutters

Indexable inserts for copying smoothing or finishing milling cutters with the cutter form designation P3204-D16 from Walter AG, Tübingen, Germany, made of a fine-grained hard metal grade with 7 wt. % Co and a WC grain size of approx. 1 µm were provided with coatings according to the invention and a comparison coating according to the prior art and the coated tools were compared in cutting tests. Compositions of mixed targets indicated in these are given in the form of at. % ratios of the metals contained.

Example 1 a Invention

Layer sequence: $[A-B]_1$
Production:
Layer (A): Arc vapour deposition; Ti—Al mixed target (Ti:Al=50:50); Bias: 120 V DC; 4 Pa $N_2$; 160 A evaporator current; Deposition temperature: 550° C.;
  Layer thickness: 150 nm
Layer (B): Arc vapour deposition; Ti—Si mixed target (Ti:Si=85:15) and Al—Cr mixed target (Al:Cr=70:30); Bias: 120 V DC; 4 Pa $N_2$; 160 A evaporator current; Deposition temperature: 550° C.; Rotating substrate carrier
  Layer thickness: 1.85 µm
  Thicknesses of the individual sublayers of TiSiN and AlCrN: approx. 7 nm
  Number of individual sublayers of TiSiN and AlCrN: approx. 132 in each case
Total thickness of the wear protection coating: 2 µm
Hardness: 3700 HV
E-modulus: 420 GPa Example 1 b Invention Layer sequence: $[A-B]_{20}$
Production:
Layer (A): Arc vapour deposition; Ti—Al mixed target (Ti:Al=50:50); Bias: 120 V DC; 4 Pa $N_2$; 160 A evaporator current; Deposition temperature: 550° C.;
  Layer thickness: 50 nm
Layer (B): Arc vapour deposition; Ti—Si mixed target (Ti:Si=85:15) and Al—Cr mixed target (Al:Cr=70:30); Bias: 120 V DC; 4 Pa $N_2$; 160 A evaporator current; Deposition temperature: 550° C.; Rotating substrate carrier
  Layer thickness: 56 nm
  Thicknesses of the individual sublayers of TiSiN and AlCrN: approx. 7 nm
  Number of individual sublayers of TiSiN and AlCrN: approx. 4 in each case
Total thickness of the wear protection coating: 2.2 µm
Hardness: 3450 HV
E-modulus: 420 GPa Example 1 c Invention Layer sequence: $[A-B]_{10}-C$
Production:
Layer (A): Arc vapour deposition; Ti—Al mixed target (Ti:Al=50:50); Bias: 120 V DC; 4 Pa $N_2$; 160 A evaporator current; Deposition temperature: 550° C.;
  Layer thickness: 50 nm
Layer (B): Arc vapour deposition; Ti—Si mixed target (Ti:Si=85:15) and Al—Cr mixed target (Al:Cr=70:30); Bias: 120 V DC; 4 Pa $N_2$; 160 A evaporator current; Deposition temperature: 550° C.; Rotating substrate carrier
  Layer thickness: 56 nm
  Thicknesses of the individual sublayers of TiSiN and AlCrN: approx. 7 nm
  Number of individual sublayers of TiSiN and AlCrN: approx. 4 in each case
Layer (C): Arc vapour deposition; Ti—Si mixed target (Ti:Si=85:15) and Al—Cr mixed target (Al:Cr=70:30); Bias: oscillating (0.004 Hz) 60 V and 120 V DC; 4 Pa $N_2$; 160 A evaporator current; Deposition temperature: 550° C.; Rotating substrate carrier
  Layer thickness: 1.0 µm
Total thickness of the wear protection coating: 2.1 µm
Hardness: 3900 HV
E-modulus: 430 GPa Example 1 d Comparison Production:
TiAlN layer: Arc vapour deposition; Ti—Al mixed target (Ti:Al=33:67); Bias: 120 V DC; 4 Pa $N_2$; 160 A evaporator current; Deposition temperature: 550° C.;
  Layer thickness: 2.3 µm
Hardness: 3400 HV
E-modulus: 380 GPa Cutting Tests The coated tools were compared in milling tests and the maximum tool flank wear $V_{bmax}$ was determined over 1 to 8 passes over the curved workpiece surface. The results given in the following Table 1 are mean values based in each case on 2 tests for each tool and for each number of passes.

Workpiece: Steel 60HRC

Cutting conditions: Cutting speed $v_c$=250 m/min
  Tooth feed $f_z$=0.1 mm
  Working depth $a_p$=0.5 mm
  Working depth $a_e$=0.5 mm
  Protrusion $x_s$=147.44 mm
  Milling without cooling

TABLE 1

| Number of passes | 1 | 2 | 3 | 4 | 5 | 6 | 7 | 8 |
|---|---|---|---|---|---|---|---|---|
| | Wear $V_b$max [mm] | | | | | | | |
| Ex. 1 a (invention) | 0.03 | 0.04 | 0.08 | 0.09 | 0.11 | 0.12 | 0.15 | 0.18 |
| Ex. 1 b (invention) | 0.03 | 0.04 | 0.07 | 0.08 | 0.10 | 0.11 | 0.13 | 0.15 |
| Ex. 1 d (comparison) | 0.06 | 0.07 | 0.1 | 0.12 | 0.14 | 0.2 | — | — |

The invention claimed is:

1. A tool, comprising:
  a main body made of hard metal, cermet, ceramic, steel or high-speed steel, and
  a multi-layer wear protection coating which is applied on the main body by a PVD process,
  wherein the wear protection coating comprises
  at least one layer (A) of $Ti_aAl_{(1-a)}N$ with 0.33≤a≤1 and with a layer thickness of from 20 nm to 3 µm, and
  at least one layer (B) of a sequence of at least 4 alternating superposed sublayers of $Ti_bSi_{(1-b)}N$ and $Al_cCr_{(1-c)}N$ with 0.70≤b≤0.98 and 0.3≤c≤0.75, each of the sublayers having a layer thickness that is the same and is from 3.0 nm to 9.0 nm and forming a periodic structure, and
  optionally in addition at least one layer (C) of $Ti_dSi_{(1-d)}N$ with 0.70≤d≤0.98 and with a layer thickness of from 50 nm to 1 µm.

2. The tool according to claim 1, wherein the layer (B) exhibits a sequence of at least 4 sublayers of $Ti_bSi_{(1-b)}N$ and 4 sublayers of $Al_cCr_{(1-c)}N$ arranged superposed in alternation and/or wherein the layer (B) exhibits a sequence of at most 1500 sublayers of $Ti_bSi_{(1-b)}N$ and 1500 sublayers of $Al_cCr_{(1-c)}N$ arranged superposed in alternation.

3. The tool according to claim 1, wherein the layer (B) exhibits a total layer thickness of from 40 nm to 3 µm.

4. The tool according to claim 1, wherein the wear protection coating exhibits one of the following sequences of layers, in which m, n, o, p, q and r are whole numbers>0:
  [A-B]$_n$ with 1≤n≤100
  ([A-B]$_n$-C)$_m$ with 1≤n≤100 and 15≤m≤20
  A-[B-C]$_n$ with 1≤n≤30
  [A-B-C]$_n$ with 2≤n≤30
  {([A-B]$_o$-C)$_q$-(A-[B-C]$_p$)$_r$}$_m$ with 1≤o≤30, 1≤p≤30, 1≤q≤30, p+q≥2, (13q+25r)m≤500.

5. The tool according to claim 1, wherein the sublayers of $Ti_bSi_{(1-b)}N$ and $Al_cCr_{(1-c)}N$ exhibit a cubically face-centered crystal structure.

6. The tool according to claim 1, wherein the wear protection coating exhibits a total thickness of from 0.5 µm to 10 µm.

7. The tool according to claim 6, wherein the total thickness of the wear protection coating is from 1.0 µm to 3.0 µm.

8. The tool according to claim 1, wherein the wear protection coating includes, at least in regions arranged as an outermost layer, a thin wear recognition layer with a thickness of from 0.1 to 1.5 µm.

9. The tool according to claim 8, wherein the thin wear recognition layer is a TiN or ZrN layer.

10. The tool according to claim 1, wherein the wear protection coating exhibits a Vickers hardness HV of from 2500 to 4000.

11. The tool according to claim 10, wherein the Vickers hardness HV of the wear protection coating is from 3000 to 3500.

12. The tool according to claim 1, wherein the wear protection coating exhibits a modulus of elasticity (E-modulus) of >380 GPa.

13. The tool according to claim 12, wherein the modulus of elasticity (E-modulus) of the wear protection coating is >400 GPa.

14. The tool according to claim 1, wherein the tool is an indexable cutter insert and/or wherein the tool is a solid hard metal tool.

15. The tool according to claim 1, wherein the wear protection coating exhibits a mean surface roughness Ra, measured over a length of 10 µm, of ≤1.0 µm.

16. The tool according to claim 15, wherein the mean surface roughness Ra, measured over a length of 10 µm, is ≤0.5 µm.

17. The tool according to claim 1, wherein the wear protection coating exhibits the following sequence of layers, in which n is a whole number>0:
  [A-B]$_n$ with 1≤n≤100.

18. The tool according to claim 1, wherein the wear protection coating exhibits one of the following sequences of layers, in which m and n are whole numbers>0:
  ([A-B]$_n$-C)$_m$ with 1≤n≤100 and 15≤m≤20
  [A-B-C]$_n$ with 2≤n≤30.

19. The tool according to claim 1, wherein the wear protection coating includes one or more further layers having a composition of TiN, TiAlN, TiCN, AlCrN, TiAlCrN or TiAlCrSiN.

20. The tool according to claim 19, wherein the wear protection coating includes, at least in regions arranged as an outermost layer, a thin wear recognition layer with a thickness of from 0.1 to 1.5 µm.

21. The tool according to claim 1, wherein the wear protection coating includes one or more further layers having a composition including one or more of Ti, Al, Cr and Si and one or more of N, B, C and O.

22. The tool according to claim 21, wherein the wear protection coating includes, at least in regions arranged as an outermost layer, a thin wear recognition layer with a thickness of from 0.1 to 1.5 µm.

* * * * *